United States Patent

Kalenian et al.

[11] Patent Number: 5,961,169
[45] Date of Patent: Oct. 5, 1999

[54] APPARATUS FOR SENSING THE PRESENCE OF A WAFER

[75] Inventors: Bill Kalenian, San Luis Obispo; Terry L. Lentz, Templeton, both of Calif.

[73] Assignee: Strasbaugh, San Luis Obispo, Calif.

[21] Appl. No.: 09/124,160

[22] Filed: Jul. 27, 1998

[51] Int. Cl.$^6$ .............................. B26J 15/06; B66C 1/02
[52] U.S. Cl. ...................... 294/64.1; 294/907; 414/941; 901/40; 269/21
[58] Field of Search ............................ 294/64.1–65, 907; 414/627, 737, 752, 941; 901/40, 46; 269/21; 271/590, 96, 108; 279/3

[56] References Cited

U.S. PATENT DOCUMENTS

| | | | |
|---|---|---|---|
| 4,221,356 | 9/1980 | Fortune | 294/64.1 |
| 4,428,815 | 1/1984 | Powell et al. | 294/64.1 |
| 4,620,738 | 11/1986 | Schwartz et al. | 294/64.1 |
| 4,750,768 | 6/1988 | Kumar | 294/64.1 |
| 5,324,087 | 6/1994 | Shimose et al. | 294/907 |
| 5,423,716 | 6/1995 | Strasbaugh | 269/21 |

*Primary Examiner*—Dean J. Kramer
*Attorney, Agent, or Firm*—Daniel C. McKown

[57] ABSTRACT

Apparatus for use in a semiconductor wafer polishing machine of a type in which the wafer is picked up and held by a suction cup effect between the wafer and a resilient diaphragm on the wafer carrier. The apparatus permits the presence or absence of a wafer on the carrier to be sensed so that this information can be used in controlling the operation of the machine. In normal operation, a vacuum is applied to a downwardly-opening plenum that is covered by a resilient diaphragm. The present invention is the addition to the wafer carrier of an air conduit opening into the plenum through an air port and connected to an orifice so that air can flow through the orifice, through the air conduit and the air port into the plenum at a rate that is slow relative to the capacity of the vacuum pump. The present invention further requires the addition of a pressure sensor for sensing the pressure in the air conduit or alternatively in the vacuum conduit. The sensed pressure in the vacuum conduit is lower in the absence of a wafer than in the presence of a wafer, and the sensed pressure in the air conduit is greater in the absence of a wafer than it is when a wafer is present.

10 Claims, 6 Drawing Sheets

Fig. 2

EFFECT OF LOSS OF WAFER

| | | PORT THAT IS COVERED BY RESILIENT DIAPHRAGM WHEN VACUUM IS APPLIED IN ABSENCE OF WAFER | | |
|---|---|---|---|---|
| | | VACUUM PORT 16 | AIR PORT 22 | BOTH 16 AND 22 |
| Pressure That is Sensed | $P_V$ | $P_V$ decreases Fig. 3 | $P_V$ decreases Fig. 4 | $P_V$ decreases Fig. 5 |
| | $P_A$ | $P_A$ increases Fig. 6 | $P_A$ increases Fig. 7 | $P_A$ increases Fig. 8 |

APPARATUS FOR SENSING THE PRESENCE OF A WAFER

BACKGROUND OF THE INVENTION

1. Field of the Invention

The present invention is in the field of semiconductor manufacturing and specifically relates to apparatus for sensing when a wafer is present and properly seated on the carrier of a wafer polishing machine, which is a sophisticated numerically-controlled machine that greatly reduces the need for intervention by a human operator. A typical wafer is several inches in diameter and about 680 microns thick; one micron is 1 millionth of meter.

In the polishing machine, the movement of the wafer carrier is programmed to acquire a wafer from a first station, to transport the wafer to a polishing surface, to drive the wafer across the rotating polishing surface, to carry the wafer from the polishing surface to the second station, and to release the wafer at the second station. The present invention provides a way of determining, prior to each of these automated operations, whether the wafer is, in fact, present and in its proper place on the carrier.

2. The Prior Art

Pertinent aspects of the polishing machine are described in U.S. Pat. No. 5,423,716 issued Jun. 13, 1995 to Strasbaugh. That patent is incorporated herein by reference to avoid unnecessary repetition; the patent provides valuable background for a better understanding of the present invention.

Briefly, U.S. Pat. No. 5,423,716 describes the use of a resilient diaphragm to acquire and hold a wafer that is being processed. The carrier includes a downwardly opening plenum, and the resilient diaphragm covers the opening. The wafer to be acquired is elevated into contact with the resilient diaphragm. A vacuum is then applied to the plenum, causing the diaphragm to bulge into the plenum and to apprehend the upper surface of the wafer by means of a "suction cup" effect. So long as the vacuum is maintained, the wafer remains held against the underside of the carrier. This condition is maintained while the wafer is being carried by the carrier to the polishing pad. When it is desired to remove a uniform thickness of material across the face of a wafer, the vacuum is relieved and an overpressure is applied to the plenum. After having been polished, the wafer must be transported from the polishing pad to another station, and to accomplish this a vacuum is again applied to the plenum.

Although the "suction cup" technique described in U.S. Pat. No. 5,423,716 can be applied in an autonomous machine with success, subsequent experience has shown that occasionally the wafer is not acquired or does not seat properly on the carrier. In some instances the desired seal between the resilient diaphragm and the wafer does not form, or gives way, causing the carrier to leave the wafer behind or to drop the wafer in transit. When any of these rare circumstances occurs, it is desirable to stop the operation of the machine and to produce an alarm so that a human operator can intervene.

SUMMARY OF THE INVENTION

The object of the present invention is to continuously provide a signal so long as the wafer is present and properly seated on the carrier; interruption of this signal during certain machine operations can be used to trigger an alarm and to stop the operation of the machine.

The present invention is based on the following observed phenomenon. When vacuum is applied to the plenum in the absence of a wafer, the resilient diaphragm is strongly sucked into the plenum and is drawn against the upper wall of the plenum; in contrast, if a vacuum is applied to the plenum and a wafer is present, the resilient diaphragm does not bulge into the plenum as far, and does not make contact with the upper wall of the plenum. In the first instance, the full pressure of the atmosphere bears against the exposed surface of the resilient diaphragm, but in the second instance, the pressure bearing on that surface must be less than atmospheric pressure or else the wafer could not be held.

Directly measuring the pressure in the space between the wafer and the resilient diaphragm does not appear to be a possibility since that space becomes vanishingly small at the beginning of the acquisition process when the wafer is brought into contact with the resilient diaphragm before the vacuum is applied to the plenum. Thus, although the underlying phenomenon was known, it remained for the present inventors to create an apparatus for utilizing the phenomenon to produce the desired signal indicating that the wafer is present and is properly seated.

In accordance with the present invention, the inventors provided a second port to the plenum for admitting air into the plenum at a rate that is slow compared to the capacity of the vacuum pump. The inventors positioned the vacuum port and the air port at locations within the plenum at which one or both of the ports is covered when the wafer is absent from the carrier, and so that neither the vacuum port nor the air port is covered when the wafer is present. The vacuum port is connected to a vacuum pump by a vacuum conduit, and the air port is connected via an air conduit to a restrictive orifice through which air is inducted from the atmosphere. Finally, a pressure sensor is inserted into either or both conduits for sensing the pressures in those conduits and producing an electrical signal in response to changes in the sensed pressure. The pressure changes result from the presence or absence of a wafer on the carrier.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 2 is a table derived from FIG. 1;

DETAILED DESCRIPTION OF THE INVENTION

Figure 1:
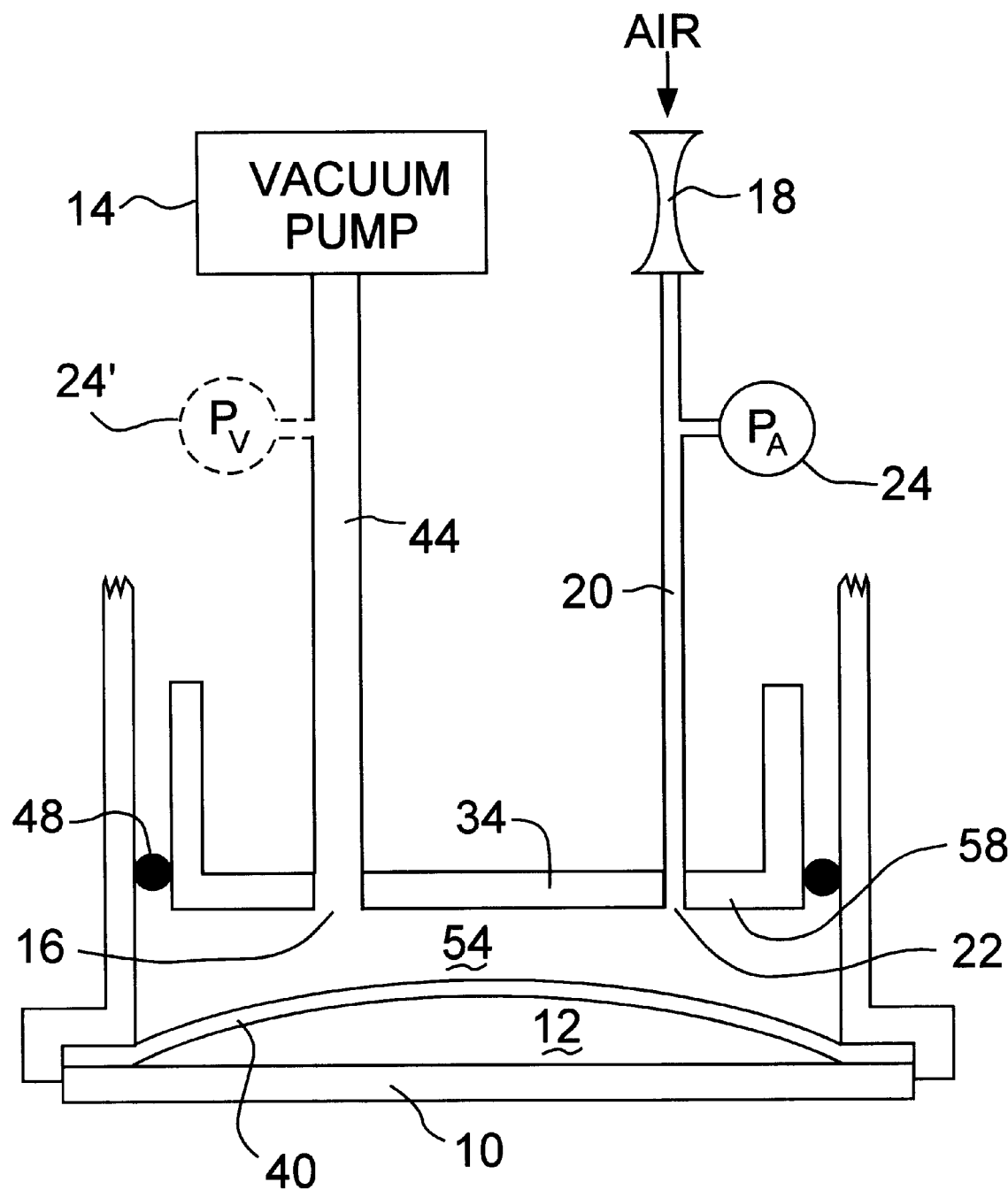
FIG. 1 is a conceptual diagram showing a generic representation of the present invention for purposes of explanation.

FIG. 1 shows a simplified carrier in accordance with the present invention. It is shown in the configuration that results when the carrier has acquired and is holding a wafer 10. The wafer is held in place on the underside of the carrier by a partial vacuum that exists within the space 12 that is bounded above by the resilient diaphragm 40 and bounded below by the wafer 10. A space of variable shape, herein referred to as the plenum 54, is bounded above by the lower face 58 of the floating piston 34 and is bounded below by the resilient diaphragm 40. An O-ring 48 maintains a seal while permitting the floating piston 34 to be raised and lowered within the carrier.

A vacuum conduit 44 is connected at one end to a vacuum pump 14 and its other end terminates at a vacuum port 16 that enters into the plenum 54.

The elements in FIG. 1 described to this point are counterparts of the carrier described in U.S. Pat. No. 5,423,716; where possible, the reference numerals used in that patent have been retained for those elements.

The present inventors have found that by adding three elements to the carrier described in U.S. Pat. No. 5,423,716, it becomes possible to sense when the wafer is present and is properly seated. These added elements include an orifice 18, which is a small hole through which air can leak into the system at a slow rate. In the preferred embodiment, the diameter of the orifice is approximately 0.010 inch in diameter. The orifice 18 is connected to an air conduit 20 that communicates with the plenum 54 through the air port 22. The third added element, in addition to the orifice 18 and the air conduit 20, is a pressure sensor 24 that may be connected to the air conduit 20 to sense the pressure in the air conduit, or alternatively, the pressure sensor may be connected to the vacuum conduit 44 to sense the pressure in it. In the latter alternative, the pressure sensor is referenced as 24' and shown in dashed lines in FIG. 1. The pressure in the air conduit is denoted by the symbol $P_A$ and the pressure in the vacuum conduit is denoted by the symbol $P_v$. There is no harm in sensing both, but only one is required for proper functioning of the system.

The three added elements, that make possible the sensing of the presence of the wafer, namely the orifice 18, the air conduit 20, and the pressure sensor 24, may be relatively simple. For example, the air conduit 20 may be a short length of tubing, the orifice 18 may be a plug with a hole in it, and the pressure sensor 24 may be a pressure-actuated electrical switch.

In the preferred embodiment the resilient diaphragm is approximately two millimeters in thickness and is composed of a synthetic rubber. When no vacuum is applied to the plenum 54, the resilient diaphragm 40 lies in a plane covering the lower end of the carrier. When a vacuum is applied to the plenum, a pressure difference prevails between the upper and lower surfaces of the diaphragm, which bulges into the carrier until the forces resulting from the pressure differential are balanced by the elastic restoring forces within the diaphragm. In accordance with the present invention, when vacuum is applied to the plenum 54 in the absence of a wafer, the diaphragm 40 is drawn back against the lower surface 58 of the floating piston, and may cover and seal either or both of the ports 16 and 22, depending on the specific locations of the ports 16 and 22. For the present invention to function, at least one of the ports must become covered by the resilient diaphragm when vacuum is applied to the plenum in the absence of a wafer.

When a wafer is present and the vacuum is applied, the diaphragm 40 sees a smaller pressure differential because the lower surface of the diaphragm is exposed to a partial vacuum. Because the pressure differential is less, the diaphragm does not bulge as much, and does not make contact with the lower face 58 of the floating piston. In this case, the ports 16 and 22 remain uncovered.

With these considerations in mind, and also bearing in mind that an increase in vacuum is a decrease in pressure, the results shown in FIG. 2 can be derived from study of FIG. 1. As seen in FIG. 2, there are six possible embodiments of the present invention. The diaphragm may cover the port 16, the port 22, or both of them when vacuum is applied in the absence of a wafer. Independent of these three possibilities are the two possibilities for measuring the pressure; either in the air conduit 20 or in the vacuum conduit 44. In theory both pressures could be monitored, but that is not necessary. The six embodiments derived from these considerations are shown in FIGS. 3–8, as indicated in FIG. 2. Each of these FIGS. 3–8 shows the embodiment in the configuration that results when vacuum is applied in the absence of a wafer.

Figure 3:
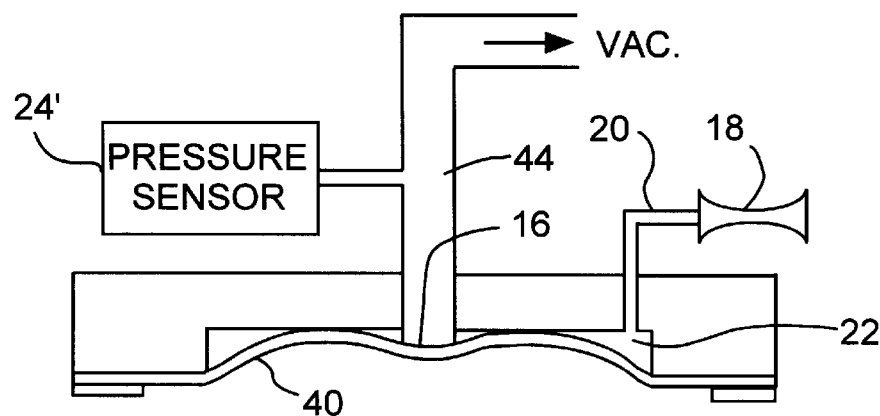
FIG. 3 is a diagram showing a first embodiment of the present invention.
Figure 4:
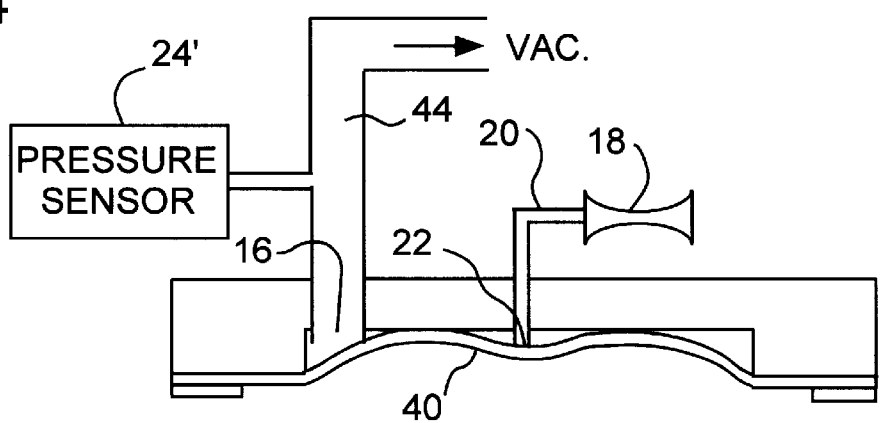
FIG. 4 is a diagram showing a second embodiment of the present invention.
Figure 5:
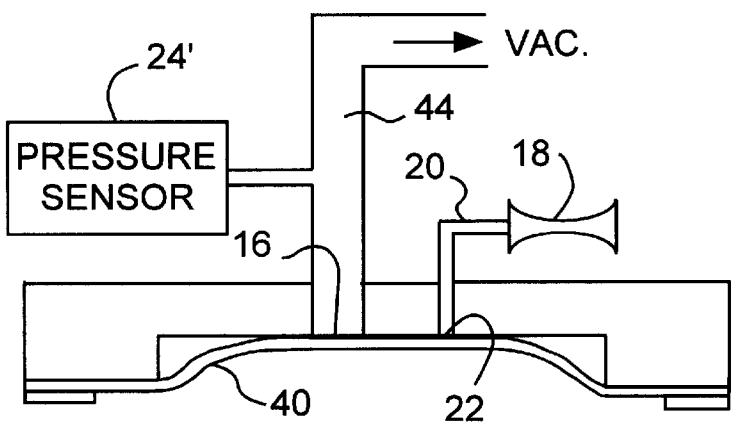
FIG. 5 is a diagram showing a third embodiment of the present invention.

In FIGS. 3, 4 and 5, the pressure in the vacuum conduit 44 is sensed by the pressure sensor 24'. In FIG. 3, the vacuum port 16 is covered by the resilient diaphragm 40 when vacuum is applied in the absence of a wafer, but the air port 22 remains uncovered, because of its location. In FIG. 4, the air port 22 is covered by the resilient diaphragm 40 when vacuum is applied in the absence of a wafer, but the vacuum port 16 remains uncovered. In FIG. 5, both the vacuum port 16 and the air port 22 are covered by the resilient diaphragm.

Figure 6:
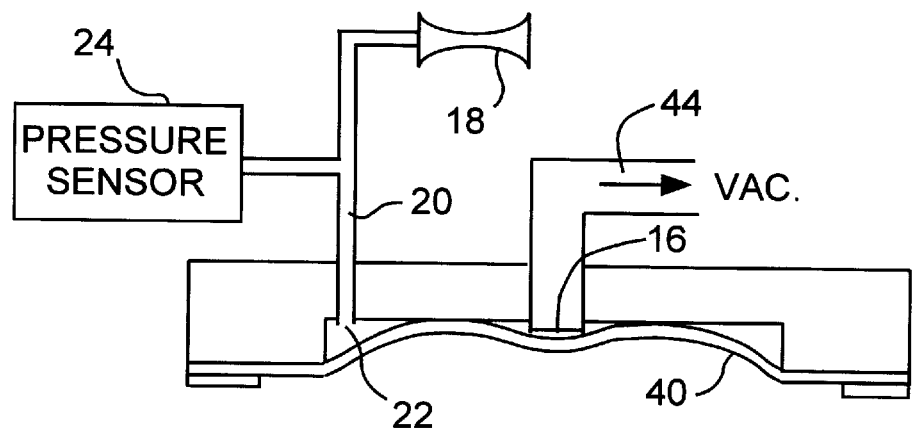
FIG. 6 is a diagram showing a fourth embodiment of the present invention.
Figure 7:
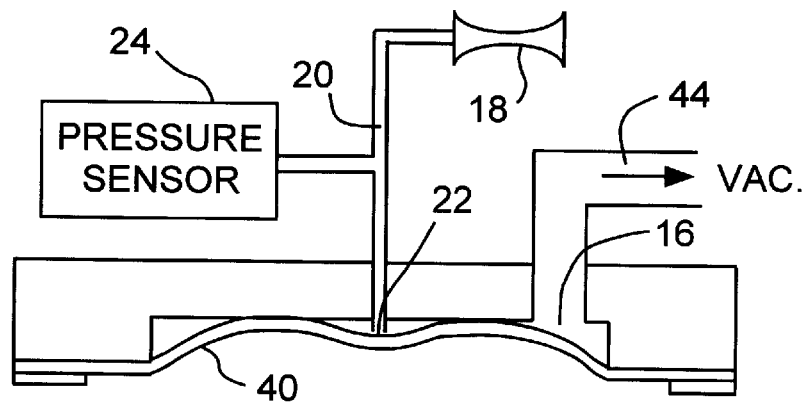
FIG. 7 is a diagram showing a fifth embodiment of the present invention.
Figure 8:
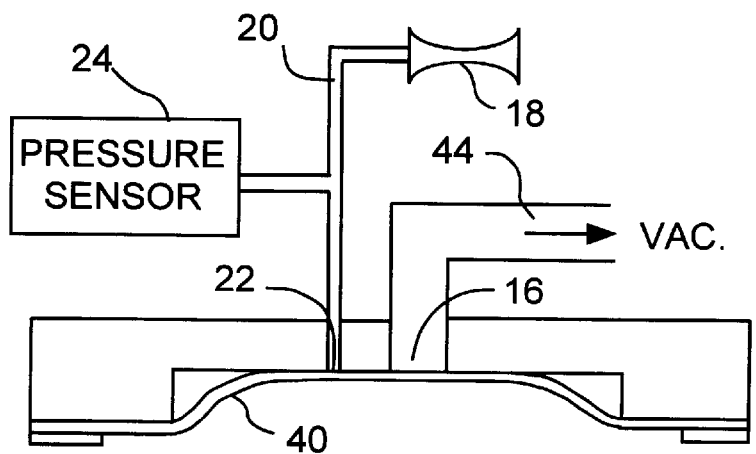
FIG. 8 is a diagram showing a sixth embodiment of the present invention.

In FIGS. 6, 7 and 8, the pressure in the air conduit 20 is sensed by the pressure sensor 24. In FIG. 6, the vacuum port 16 is covered by the resilient diaphragm 40 but the air port 22 remains uncovered. In FIG. 7, the air port 22 is covered by the resilient diaphragm 40 but the vacuum port 16 remains uncovered. In FIG. 8, both the vacuum port 16 and the air port 22 are covered by the resilient diaphragm.

Figure 9:
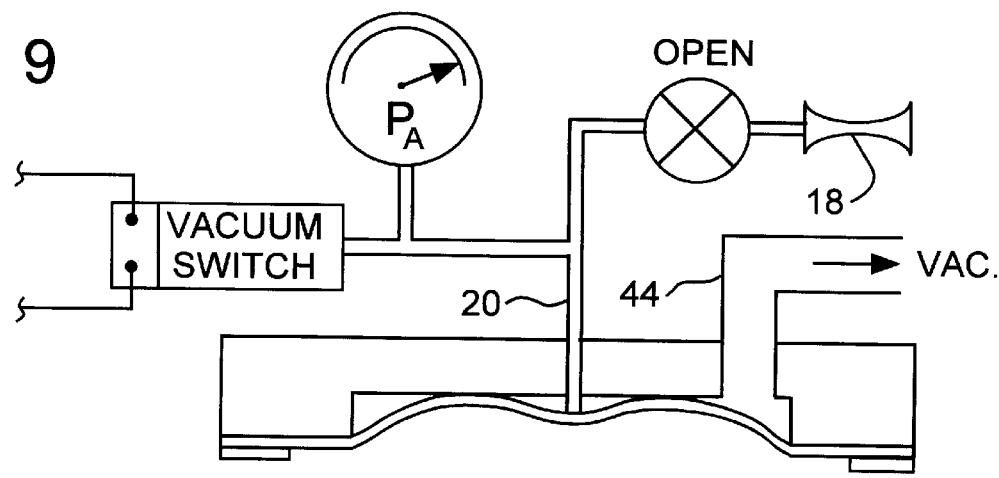
FIG. 9 is a diagram showing a preferred embodiment of the invention when a wafer is not present on the carrier.
Figure 10:
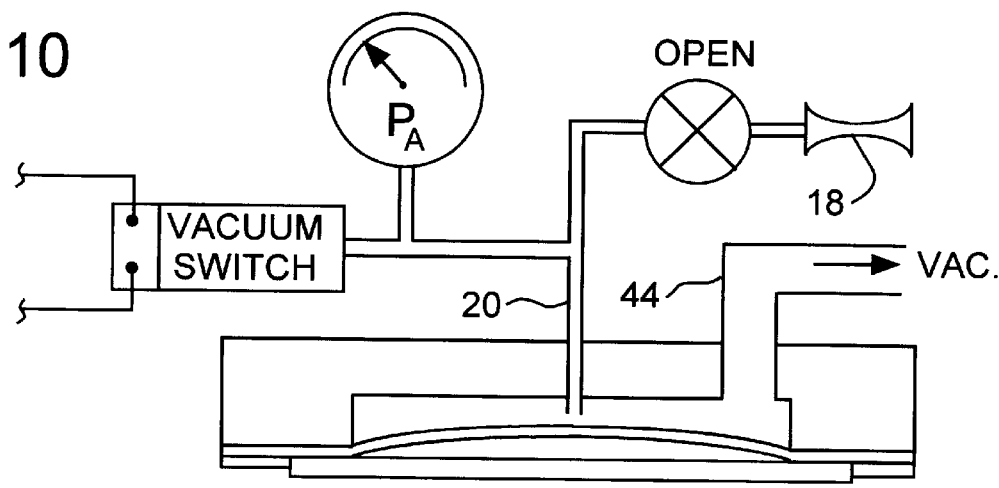
FIG. 10 is a diagram showing the preferred embodiment of FIG. 9 when a wafer is present.
Figure 11:
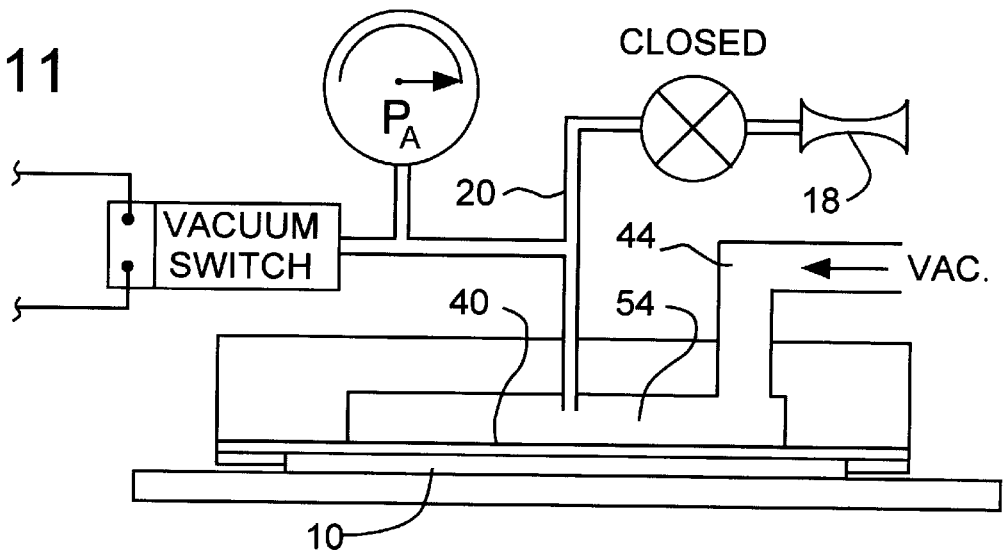
FIG. 11 is a diagram showing the preferred embodiment of FIG. 9 when a wafer is being polished.

FIGS. 9, 10 and 11 show the configuration of the preferred embodiment of the invention at various stages in its operation. This embodiment is also shown in FIG. 7. It is preferred over other embodiments largely for convenience in installing the three vital elements—the air conduit, the orifice, and the pressure sensor—into the existing polishing machine. FIG. 9 shows the configuration of that embodiment when vacuum is applied in the absence of a wafer. FIG. 10 shows the configuration of the embodiment of FIG. 9 when vacuum is applied and a wafer is present. FIG. 11 shows the embodiment of FIGS. 9 and 10 during the polishing phase. In this phase, air under pressure is supplied to the plenum 54 through the vacuum conduit 44. The air pressure is uniform across the resilient diaphragm 40, causing the resilient diaphragm to bear down against the wafer 10 with a pressure that is uniform on all parts of the wafer.

Figure 12:
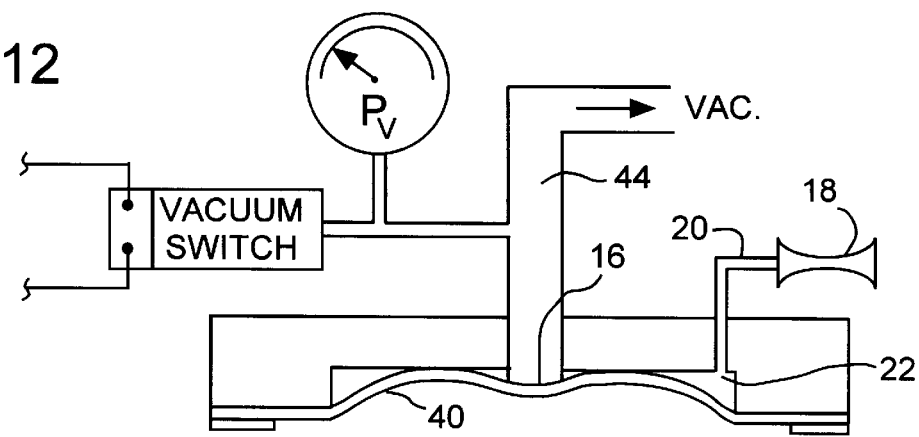
FIG. 12 is a diagram showing an alternative embodiment of the invention when a wafer is not present on the carrier.
Figure 13:
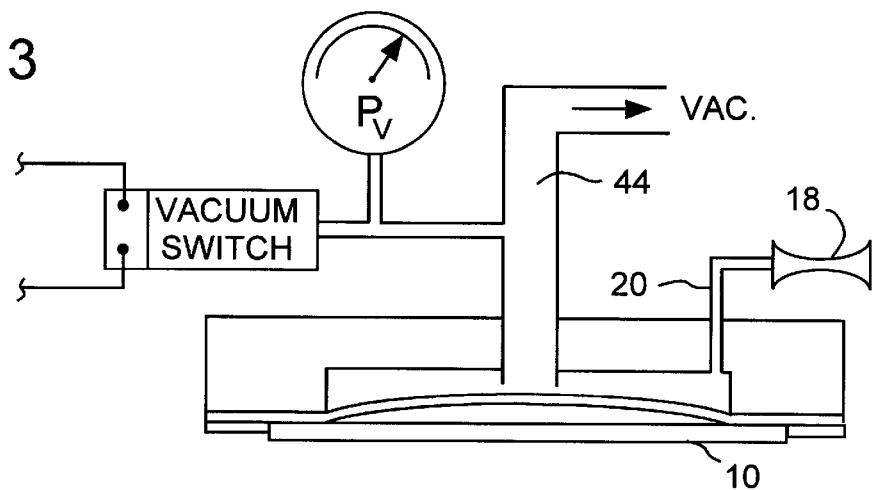
FIG. 13 is a diagram showing the alternative embodiment of FIG. 12 when a wafer is present; and, FIG. 14 is a diagram showing the alternative embodiment of FIG. 12 when a wafer is being polished.
Figure 14:
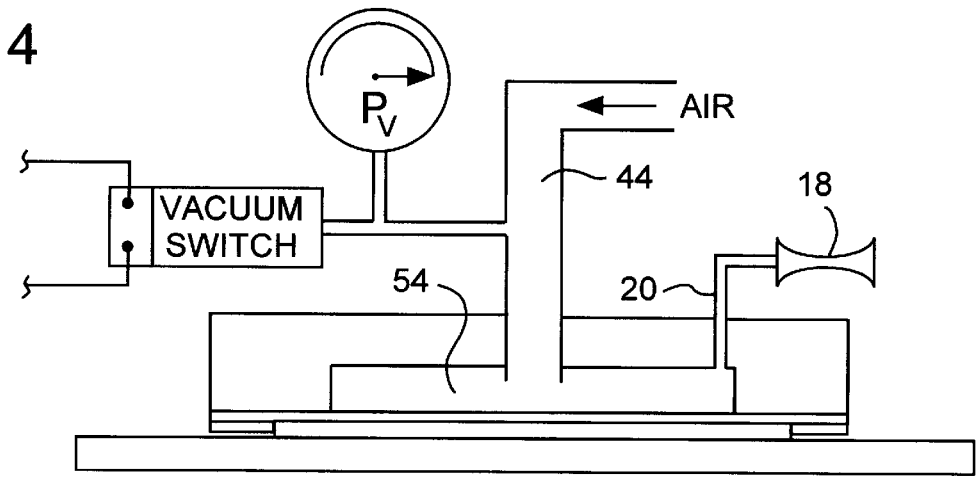

FIGS. 12, 13 and 14 show the configuration of an alternative embodiment of the invention at various phases of its operation. In the embodiment of FIGS. 12, 13 and 14, the pressure in the vacuum conduit 44 is sensed. This embodiment is also shown in FIG. 3.

FIG. 12 shows the alternative embodiment in the situation where vacuum is applied in the absence of a wafer. The vacuum port 16 is covered by the resilient diaphragm 40, but the air port 22 remains uncovered.

FIG. 13 shows the embodiment of FIG. 12 in the situation where vacuum is applied to the vacuum conduit 44 and a wafer 10 is present.

FIG. 14 shows the embodiment of FIGS. 12 and 13 during the polishing phase of its operation. In this phase, air under pressure is forced into the plenum 54 through the vacuum conduit 44.

Another reason the embodiment of FIGS. 9, 10 and 11 is preferred over the embodiment of FIGS. 12, 13 and 14 is that the former is "fail safe" in the following sense. If an unintended leak develops in the plenum 54 or the conduits 20 and 44, the effect of the leak is to increase the sensed pressure. Since the polishing machine interprets an increase in pressure as the absence or loss of a wafer, the machine will suspend operation until the leak has been remedied. In contrast, in the alternative embodiment of FIGS. 12, 13 and 14, the unintended leak increases the sensed pressure, which the polishing machine interprets as indicating that a wafer is present. If the leak is large enough, the machine may continue its program of operations even though the wafer is absent or has become lost.

In the preferred embodiment of FIGS. 9, 10 and 11, as well as in the alternative embodiment of FIGS. 12, 13 and 14, the capacity of the vacuum pump that applies vacuum to the plenum 54 through the vacuum conduit 44 is large enough to prevent the air that enters the plenum through the orifice 18 and the air conduit 20 from seriously increasing the pressure in the plenum; otherwise, there might not be sufficient suction to retain the wafer. On the other hand, the difference in the sensed pressure between when the wafer is present and when it is absent must be large enough to be reliably detected. In practice, for a particular vacuum pump, the orifice 18 may be implemented in the form of a valve; the size of the orifice can then be gradually increased until the optimum setting is found.

The present invention does not require the vacuum port 16 and/or the air port 22 to lie on the lower face 58 of the floating piston 34 as shown in FIG. 1. The present invention comprehends implementations in which the vacuum port 16, the air port 22, or both of them are located below the lower face 58, as shown in FIGS. 3, 4, 6 and 7.

In the above description, reference has been made to the pressure prevailing at various points in the system. This has been done in the interest of consistency. Clearly, all of the pressures are less than atmospheric pressure, and the pressure sensors 24 and 24' are in fact vacuum gauges or vacuum switches. Such devices are widely available commercially. At low pressures one might use a vacuum gauge that produces an electrical signal representative of the pressure, and the presence or absence of the wafer can be decided from the level of this signal. At higher pressures the pressure change is great enough to actuate a mechanical vacuum switch and the state of the switch indicates the presence or absence of the wafer. The implementation to be used in any particular application is well within the ability of workers in the field.

Thus, there has been described an improvement to a wafer carrier that permits the presence or absence of a wafer to be sensed, so that if a wafer has not been properly acquired or is not seated properly, the operation of the machine can be suspended. This improvement is made possible by the addition to an existing wafer carrier of three elements—an air conduit, an orifice, and a pressure sensor. The pressure sensor may be connected either to the air conduit or to the vacuum conduit, whichever is the more convenient.

The foregoing detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. In a wafer carrier of a type in which a plenum is bounded above by a piston plate and below by a resilient diaphragm, and in which a wafer is acquired by elevating the wafer into contact with the resilient diaphragm and then applying a vacuum to the plenum through a vacuum port and through a vacuum conduit connected to the vacuum port causing the resilient diaphragm to grip the wafer by a suction cup effect with the resilient diaphragm drawn into the plenum but not so far as to contact the piston plate, and in which in the absence of a wafer the application of the vacuum draws the resilient diaphragm farther into the plenum than when the wafer is present, the improvement comprising:

an air port entering into the plenum;

an air conduit connected to said air port and communicating with the plenum through said air port;

an orifice connected to said air conduit for admitting air into said air conduit at a limited rate; and, means communicating with a conduit chosen from the group consisting of the vacuum conduit and said air conduit for sensing the pressure within the chosen conduit;

wherein the vacuum port and said air port are so located in the plenum that at least one of these ports is covered and sealed by the resilient diaphragm when vacuum is applied to the plenum in the absence of a wafer, but neither of these ports is covered by the resilient diaphragm when the wafer is present;

whereby, if the vacuum conduit is the chosen conduit, the pressure sensed by said means is greater when the wafer is present than when the wafer is absent, and if said air conduit is the chosen conduit, the pressure sensed by said means is less when the wafer is present than when the wafer is absent, whereby the presence or absence of the wafer can be determined from the sensed pressure.

2. The improvement of claim 1 wherein in the absence of a wafer the application of the vacuum draws the resilient diaphragm far enough into the plenum so as to contact a region on the piston plate, and wherein at least one of the ports is located in the region.

3. In a wafer carrier of a type in which a plenum is bounded above by a piston plate and below by a resilient diaphragm, and in which a wafer is acquired by elevating the wafer into contact with the resilient diaphragm and then applying a vacuum to the plenum through a vacuum port and through a vacuum conduit connected to the vacuum port causing the resilient diaphragm to grip the wafer by a suction cup effect with the resilient diaphragm drawn into the plenum but not so far as to contact the piston plate, and in which in the absence of a wafer the application of the vacuum draws the resilient diaphragm farther into the plenum than when the wafer is present, the improvement comprising:

an air port entering into the plenum;

an air conduit connected to said air port and communicating with the plenum through said air port;

an orifice connected to said air conduit for admitting air into said air conduit at a limited rate; and, means communicating with the vacuum conduit for sensing the pressure within the vacuum conduit;

wherein the vacuum port is so located in the plenum that the vacuum port is covered and sealed by the resilient diaphragm only when vacuum is applied to the plenum in the absence of a wafer, but is not covered by the resilient diaphragm when the wafer is present.

4. The improvement of claim 3, wherein in the absence of a wafer the application of the vacuum draws the resilient diaphragm far enough into the plenum so as to contact a region on the piston plate, and wherein the vacuum port is located in the region on the piston plate that is contacted by the resilient diaphragm when vacuum is applied to the plenum in the absence of a wafer, the resilient diaphragm then sealing the vacuum port, but not sealing the vacuum port when a wafer is present.

5. In a wafer carrier of a type in which a plenum is bounded above by a piston plate and below by a resilient diaphragm, and in which a wafer is acquired by elevating the wafer into contact with the resilient diaphragm and then applying a vacuum to the plenum through a vacuum port and through a vacuum conduit connected to the vacuum port causing the resilient diaphragm to grip the wafer by a suction cup effect with the resilient diaphragm drawn into the plenum but not so far as to contact the piston plate, and in which in the absence of a wafer the application of the vacuum draws the resilient diaphragm farther into the plenum than when the wafer is present, the improvement comprising:

an air port entering into the plenum;

an air conduit connected to said air port and communicating with the plenum through said air port;

an orifice connected to said air conduit for admitting air into said air conduit at a limited rate; and, means communicating with the vacuum conduit for sensing the pressure within the vacuum conduit;

wherein said air port is so located in the plenum that said air port is covered and sealed by the resilient diaphragm only when vacuum is applied to the plenum in the absence of a wafer, but is not covered by the resilient diaphragm when the wafer is present.

6. The improvement of claim 5, wherein in the absence of a wafer the application of the vacuum draws the resilient diaphragm far enough into the plenum so as to contact a region on the piston plate, and wherein said air port is located in the region on the piston plate that is contacted by the resilient diaphragm when vacuum is applied to the plenum in the absence of a wafer, the resilient diaphragm then sealing said air port, but not sealing said air port when a wafer is present.

7. In a wafer carrier of a type in which a plenum is bounded above by a piston plate and below by a resilient diaphragm, and in which a wafer is acquired by elevating the wafer into contact with the resilient diaphragm and then applying a vacuum to the plenum through a vacuum port and through a vacuum conduit connected to the vacuum port causing the resilient diaphragm to grip the wafer by a suction cup effect with the resilient diaphragm drawn into the plenum but not so far as to contact the piston plate, and in which in the absence of a wafer the application of the vacuum draws the resilient diaphragm farther into the plenum than when the wafer is present, the improvement comprising:

an air port entering into the plenum;

an air conduit connected to said air port and communicating with the plenum through said air port;

an orifice connected to said air conduit for admitting air into said air conduit at a limited rate; and, means communicating with said air conduit for sensing the pressure within said air conduit;

wherein the vacuum port is so located in the plenum that the vacuum port is covered and sealed by the resilient diaphragm only when vacuum is applied to the plenum in the absence of a wafer, but is not covered by the resilient diaphragm when the wafer is present.

8. The improvement of claim 7, wherein in the absence of a wafer the application of the vacuum draws the resilient diaphragm far enough into the plenum so as to contact a region on the piston plate, and wherein the vacuum port is located in the region on the piston plate that is contacted by the resilient diaphragm when vacuum is applied to the plenum in the absence of a wafer, the resilient diaphragm then sealing the vacuum port, but not sealing the vacuum port when a wafer is present.

9. In a wafer carrier of a type in which a plenum is bounded above by a piston plate and below by a resilient diaphragm, and in which a wafer is acquired by elevating the wafer into contact with the resilient diaphragm and then applying a vacuum to the plenum through a vacuum port and through a vacuum conduit connected to the vacuum port causing the resilient diaphragm to grip the wafer by a suction cup effect with the resilient diaphragm drawn into the plenum but not so far as to contact the piston plate, and in which in the absence of a wafer the application of the vacuum draws the resilient diaphragm farther into the plenum than when the wafer is present, the improvement comprising:

an air port entering into the plenum;

an air conduit connected to said air port and communicating with the plenum through said air port;

an orifice connected to said air conduit for admitting air into said air conduit at a limited rate; and, means communicating with said air conduit for sensing the pressure within said air conduit;

wherein said air port is so located in the plenum that said air port is covered and sealed by the resilient diaphragm only when vacuum is applied to the plenum in the absence of a wafer, but is not covered by the resilient diaphragm when the wafer is present.

10. The improvement of claim 9, wherein in the absence of a wafer the application of the vacuum draws the resilient diaphragm far enough into the plenum so as to contact a region on the piston plate, and wherein said air port is located in the region on the piston plate that is contacted by the resilient diaphragm when vacuum is applied to the plenum in the absence of a wafer, the resilient diaphragm then sealing said air port, but not sealing said air port when a wafer is present.

* * * * *